(12) United States Patent
Moschiano et al.

(10) Patent No.: US 9,305,660 B2
(45) Date of Patent: *Apr. 5, 2016

(54) PAGE BUFFER CONNECTIONS AND DETERMINING PASS/FAIL CONDITION OF MEMORIES

(71) Applicant: Micron Technology, Inc., Boise, ID (US)

(72) Inventors: Violante Moschiano, Bacoli (IT); Giovanni Santin, Rieti (IT)

(73) Assignee: Micron Technology, Inc., Boise, ID (US)

( * ) Notice: Subject to any disclaimer, the term of this patent is extended or adjusted under 35 U.S.C. 154(b) by 126 days.

This patent is subject to a terminal disclaimer.

(21) Appl. No.: 14/012,602

(22) Filed: Aug. 28, 2013

(65) Prior Publication Data

US 2013/0343132 A1    Dec. 26, 2013

Related U.S. Application Data

(63) Continuation of application No. 12/896,487, filed on Oct. 1, 2010, now Pat. No. 8,526,238.

(51) Int. Cl.
| G11C 11/56 | (2006.01) |
| G11C 16/06 | (2006.01) |
| G11C 16/34 | (2006.01) |
| G11C 16/24 | (2006.01) |
| G11C 16/00 | (2006.01) |
| G11C 29/04 | (2006.01) |

(52) U.S. Cl.
CPC ........ *G11C 16/3436* (2013.01); *G11C 11/5628* (2013.01); *G11C 16/06* (2013.01); *G11C 16/24* (2013.01); *G11C 16/3454* (2013.01); *G11C 16/3481* (2013.01); *G11C 11/56* (2013.01); *G11C 16/00* (2013.01); *G11C 2029/0409* (2013.01)

(58) Field of Classification Search
CPC ............... G11C 11/5628; G11C 16/06; G11C 16/3436; G11C 16/3481; G11C 16/24; G11C 16/3454; G11C 11/56; G11C 16/00; G11C 2029/0409
USPC ............. 365/185.08, 185.22, 185.25, 185.24, 365/185.17, 185.05, 185.21, 200, 189.05
See application file for complete search history.

(56) References Cited

U.S. PATENT DOCUMENTS

| 6,288,940 B1 | 9/2001 | Kawamura |
| 2003/0133340 A1 | 7/2003 | Lee |
| 2004/0190357 A1 | 9/2004 | Scheuerlein et al. |

*Primary Examiner* — J. H. Hur
(74) *Attorney, Agent, or Firm* — Dicke, Billig & Czaja, PLLC

(57) ABSTRACT

Apparatus and methods for determining pass/fail condition of memories facilitate array efficiencies. In at least one embodiment, a set of common lines, one for each rank of page buffers corresponding to a page, determine the pass/fail status of all connected memory cells, and the pass/fail status results for each line can be combined to determine a pass/fail for the page of memory.

21 Claims, 6 Drawing Sheets

US 9,305,660 B2

PAGE BUFFER CONNECTIONS AND DETERMINING PASS/FAIL CONDITION OF MEMORIES

RELATED APPLICATIONS

This application is a continuation of U.S. patent Ser. No. 12/896,487, titled "MEMORY ARRAYS AND METHODS OF OPERATING MEMORY", filed Oct. 1, 2010, now U.S. Pat. No. 8,526,238 issued on Sep. 3, 2013, which is commonly assigned and incorporated herein by reference.

FIELD

The present disclosure relates generally to memories, and in particular, in one or more embodiments, the present disclosure relates to array efficiencies in memories.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as digit (e.g., bit) lines. In NAND flash architecture, a column of memory cells is coupled in series with only the first memory cell of the column coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Multilevel cells can take advantage of the analog nature of a traditional flash cell by assigning a bit pattern to a specific threshold voltage (Vt) range stored on the cell. This technology permits the storage of two or more bits per cell, depending on the quantity of voltage ranges assigned to the cell and the stability of the assigned voltage ranges during the lifetime operation of the memory cell.

For example, a cell may be assigned four different voltage ranges of 200 mV for each range. Typically, a dead space of 0.2V to 0.4V is between each range to keep the ranges from overlapping. If the voltage stored on the cell is within the first range, the cell is storing a logical 11 state and is typically considered the erased state of the cell. If the voltage is within the second range, the cell is storing a logical 01 state. This continues for as many ranges that are used for the cell provided these voltage ranges remain stable during the lifetime operation of the memory cell.

Since two or more states are stored in each MLC, the width of each of the voltage ranges for each state can be very important. The width is related to many variables in the operation of a memory circuit. For example, a cell could be verified at one temperature and read at a different temperature. The circuitry that determines if the cell is erased or programmed to the correct Vt range has to make that determination. That circuitry has some of its characteristics influenced by temperature. A Vt window is a sum of all of these types of differences, translating into a shift in the perceived window of the Vt. In order for the window to operate, the width of the four states plus a margin between each state should amount to the available window.

Array efficiency is one important memory parameter. The higher the array efficiency, the greater the density and capabilities of memories can be. Array efficiency is typically defined as the array area divided by the sum of the array area and the periphery area, where the array area is the total area occupied by the memory cells of the array itself, and the periphery area is the area used for supporting components of the memory. To increase array efficiency, one way is to decrease the periphery area. In MLC NAND flash memory, the biggest part of the periphery area is typically the page buffer. A typical page buffer comprises circuitry such as sense amplifiers, data latches, and a byte selector (also called a data detector). A typical data detector includes circuitry such as a column selector, a knock-out latch, and a pass/fail system. Column select is used during data loading and retrieval. Knock-out latches are used to store information about a bad column and allow its removal from verification, and the pass/fail system allows elimination of a byte from verification.

For reasons such as those stated above, and for other reasons, such as those stated below, which will become apparent to those skilled in the art upon reading and understanding the present specification, there is a need in the art for, among other things, increasing memory array efficiency.

DETAILED DESCRIPTION

Figure 1:
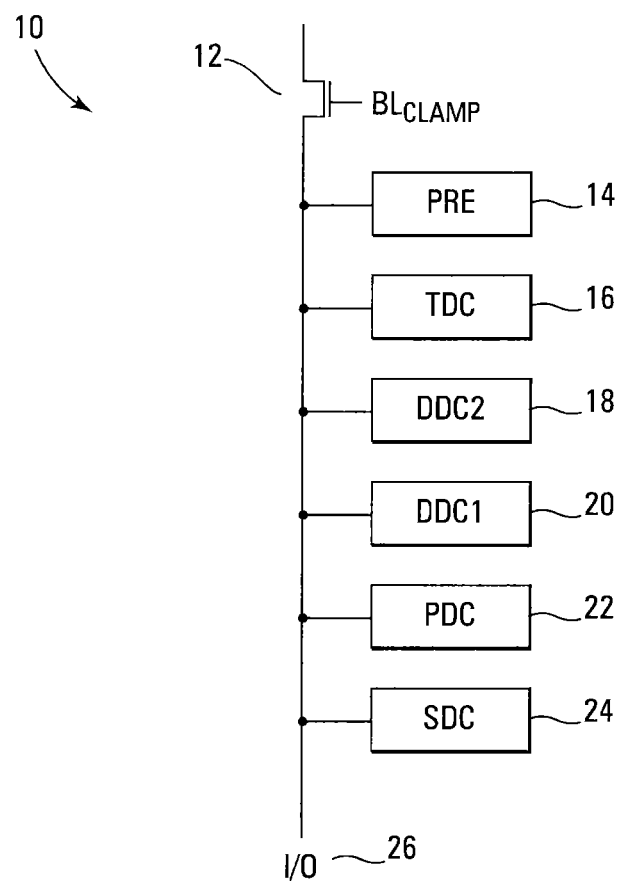
FIG. 1 is a block diagram of a dynamic data cache of the prior art.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

A block diagram of a simplified typical dynamic data cache 100 (DDC) is shown in FIG. 1. The DDC 10 comprises an access transistor 12 (e.g., bit line clamp) that connects the memory array to the DDC. When transistor 12 is turned on, a selected bit line is connected to the DDC. The DDC 10 further comprises a precharge circuit 14. When the an odd or even bit line is connected to the DDC 10, the precharge circuit 14 precharges that particular bit line prior to a sense operation.

A temporary data cache (TDC) 16 is used to temporarily store data during a program or sense operation. The data is stored in the TDC 16 before being moved to or after being moved from the primary data cache (PDC) 24, the secondary data cache (SDC) 24, dynamic cache (DDC1) 20, or dynamic cache (DDC2) 18. If the present operation is a sense operation, the data in the TDC 16 is moved to the I/O line 26 for use by external circuits such as a microprocessor that initiated the sense operation. If the present operation is a program operation, the data in the TDC 16 is moved to the selected memory cell during the portion of the operation in which the selected memory cell is programmed with the data.

The main data storage portion of the DDC 10 comprises a DDC2 circuit 18, a DDC1 circuit 20, a PDC circuit 22, and a SDC circuit 24. The DDC1 and DDC2 circuits 20, 18 are used for controlling programming and storing data for selected memory cells in combination with the PDC circuit 22. PDC circuit 22 may also be referred to as a page buffer, such as page buffers 106, 108 described in further detail below.

Figure 1A:
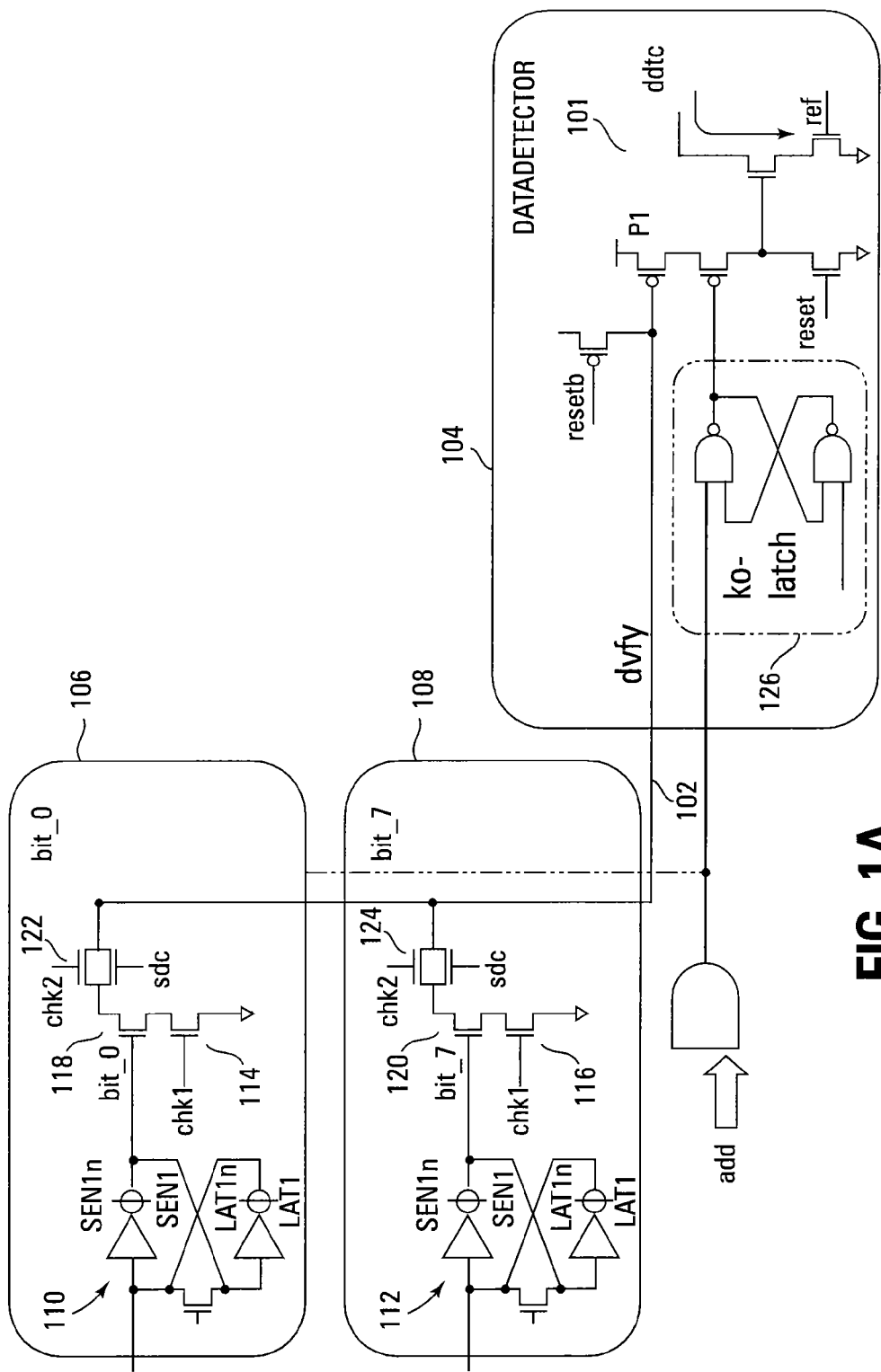
FIG. 1A is a block diagram of a part of a memory device of the prior art.

A typical NAND memory page buffer architecture is shown in FIG. 1A. Page buffers (i.e., data caches) such as buffers 106 and 108 are organized into groups of eight. Eight page buffers form a basic structure. The page buffers of this structure are connected via a common line (dvfy) 102 to a data detector circuit 104. For each structure of eight page buffers, there is a data detector circuit 104.

A typical NAND memory works by page. A page is composed of a certain number of structures such as those described (i.e., 4096 bytes represented by 4096 structures of page buffers). A page can be defined as, for example, the number of cells in a block of memory cells which are operated on by a single programming or read operation. A row of memory cells may comprise, e.g., two physical pages of memory cells, and each of those physical pages can comprise a respective two or more logical pages (e.g., an upper page and a lower page). In this manner, a single cell can store data corresponding to different logical pages. All data detectors of a page (4096 in one embodiment) are connected together. Each data detector takes up approximately 15 percent of the total structure area. The data detector logic is used to select a specific structure of eight page buffers. A pass/fail system 101 precharges the dvfy line 102, and when a cell coupled to one of the page buffers of the structure (referred to herein, by example, as a "byte" and in which a "bit" is one of the eight individual components of a byte), the entire byte is failed. Each page buffer, such as page buffers 106 and 108, comprises a latch 110, 112, a check transistor 114, 116, a program transistor 118, 120, and a sense circuit 122, 124. When a particular cell is programmed, its respective latch has a logic 0 as its output. When the particular cell of the page buffer has failed programming, (that is, not programmed), its respective latch has a logic 1 as its output.

When each page buffer that is connected to the common line indicates its respective cell has been programmed, its respective program transistors are off, so once the common line 102 is precharged, and the check transistors and sense circuits are turned on, the common line remains precharged and transistor P1 remains off. When a page buffer connected to the common line indicates its coupled cell has failed programming, the common line is discharged to ground, turning transistor P1 on, and a fail is detected. Programming continues with additional program pulses and verification until all cells are successfully programmed, or until a maximum number of programming pulses has been reached. If the byte is still failed, then it is identified as a bad byte. If the byte is identified as a bad byte, the knock-out latch 126 is set, and that byte is no longer used. Once a byte is marked as bad, that information may be stored for setting the knock-out latch on startup. Once a column is determined to be bad, the knock-out latch is set, and that removes the column from fail counting. This results in many latches that are read to determine if bytes are bad or not. This takes time and energy.

The various embodiments disclosed herein include methods and memories that can reduce the periphery area of memory arrays by eliminating elements of the data detector to allow for improved array efficiency. For purposes of this disclosure, a rank of a bit (one example of a digit) within a byte is that bit at a certain logical location within the byte. Specifically, for a first byte of eight bits identified for purposes of explanation only as bit_0, bit_1, bit_2, bit_3, bit_4, bit_5, bit_6, and bit_7, and for a second byte of eight bits identified for purposes of explanation only as bit_0, bit_1, bit_2, bit_3, bit_4, bit_5, bit_6, and bit_7, each bit_0 is identified as having the same rank. For a plurality of bits of the same identification, all bits that are identified as bit_0 within their particular byte are in the same rank within the byte.

Figure 2:
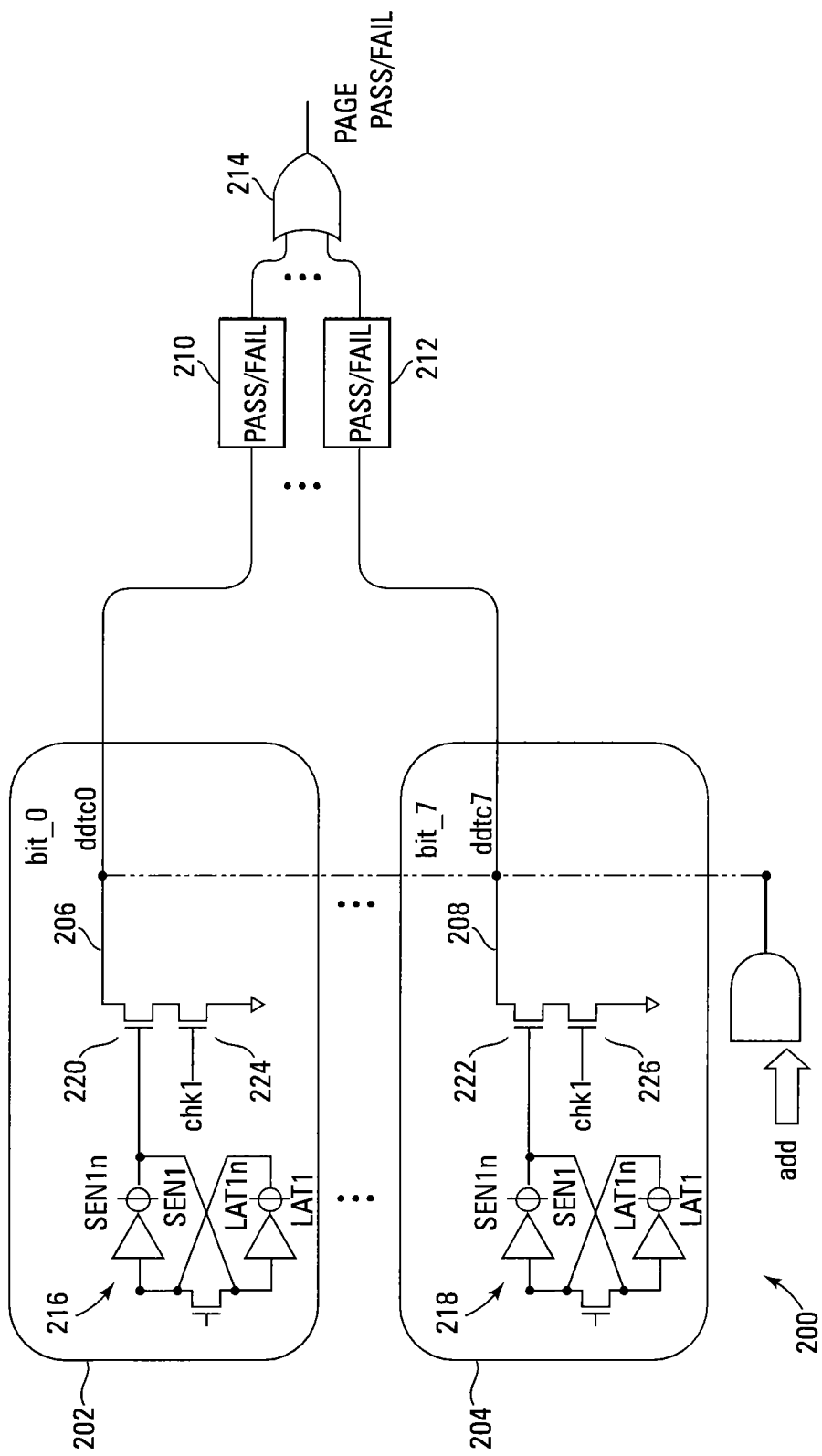
FIG. 2 is a block diagram of a memory device according to one embodiment of the present disclosure.

In one embodiment of the present disclosure, a memory device 200 with improved array efficiency is shown in FIG. 2. In this embodiment, there is no data detector as is present in the prior art. Instead, operation is performed as follows. Each byte of information comprises eight bits, with representative page buffers 202 and 204 representing those bits shown. Each of the eight bits of a byte are identified, for purposes of explanation only, as bit_0, bit_1, . . . , bit_7. In this embodiment, a common line 206 is connected in parallel to each bit_0 page buffer of a page of the memory array. A respective common line is connected in parallel to each bit_1 page buffer of the page, to each bit_2 page buffer of the page, . . . , to each bit_7 page buffer of the page (each bit_7 page buffer being connected to common line 208). Each common line allows performance of a parallel operation for each page buffer by its bit rank within its byte. In this embodiment, each of the eight common lines has its own pass/fail circuit (circuits 210 and 212 shown) to determine whether its respective common line has all cells that have successfully been programmed, or has at least one cell that has failed to program successfully.

Each pass/fail circuit can be used to determine whether the common line connected to it has been discharged, and to issue an output that indicates a pass or a fail for the cells connected to the common line. For purposes of passing, an inhibited cell is considered to be passing due to its having reached its desired threshold voltage, and having a program latch set indicating that the cell is programmed. The pass/fail outputs of each of the, in this embodiment, eight pass/fail circuits, are combined in OR logic 214 in parallel for all the bytes of one page. With this combination, a determination can be made as to whether a byte is failing.

The determination of passing or failing for a byte is determined in one embodiment through the use of the OR combination of the output from the pass/fail circuits for each of the common lines. In this embodiment, a passing indication is an indication that the cell is programmed, and a failing indication is an indication that the cell has not yet been verified as programmed. The common line connecting each page buffer bit rank as described above allows the performance of a parallel operation for each bit. If each bit is passing, then the logic signal on that bit rank's common line will be 0. If all bits on each common line are passing, then the result of the OR combination of all the common lines will be 0 indicating all bits, and therefore all bytes, are passing. If any bit that is not inhibited fails, its common line will be at a logic 1 signal, and the OR combination of the common lines will be a logic 1, indicating a failing bit. Each common line, therefore, conveys through its pass/fail circuit information indicating if all of its parallel connected bits have passed.

The determination of passing or failing for a bit is determined in one embodiment through selective sensing and use of the individual pass/fail circuits. For example, the outputs of the individual pass/fail circuits can show any bit rank (i.e., bit_0, bit_1, . . . , bit_7) that has at least one bit failing. This is indicated if the common line for that bit rank is discharged on verification. By selectively inhibiting columns, a specific failing bit can be identified. Specifically, if all columns are inhibited except one, and the common line for that bit rank is discharged, the bit on the column that is not inhibited is a failing bit. That does not preclude other bits in the bit rank being failing bits as well, but does specifically identify a particular bit as failing.

Each page buffer 202, 204 has a program latch 216, 218 with an output connected to a program indicator transistor 220, 222. The program latch is selectively connected to its respective data line through use of bit line clamp transistors (see FIG. 1). The program indicator transistors 220, 222 are connected between the common line 206, 208 and check transistors 224, 226, respectively. For page buffer 202, for example, if the corresponding cell is programmed to its desired threshold voltage after a programming pulse, the latch 216 is set and outputs a logic 0 to the gate of program indicator transistor 220. When common line 206 is precharged, and verification is performed, check transistor 224 is turned on. Since program indicator transistor 220 is off, the common line 206 remains charged, the pass/fail circuit 210 for common line 206 detects that it has not been discharged, and sends a logic 0 (pass) to OR circuit 214. If instead, the cell is not programmed to its desired threshold voltage after a programming pulse, the latch 216 outputs a logic 1 to the gate of program indicator transistor 220. Upon verification after precharging the common line 206, the check transistor 224 and program indicator transistor are both turned on, and the common line 206 is discharged to ground through transistors 220 and 224. The pass/fail circuit 210 for common line 206 detects that it has been discharged, and sends a logic 1 (fail) to OR circuit 214. Any bit, therefore, that is not passing, (that is, a cell that is not yet been verified as programmed) indicates a fail of the page through the discharge of its common line, leading to a fail on its pass/fail circuit, and a fail signal at the output of the OR circuit 214.

It should be understood that the logic 0 signal presented by pass/fail circuits 210, 212 could be a logic 1 signal, and that the output of the pass/fail circuits can be combined in a different logic function to obtain the same results, without departing from the scope of the disclosure.

Figure 3:
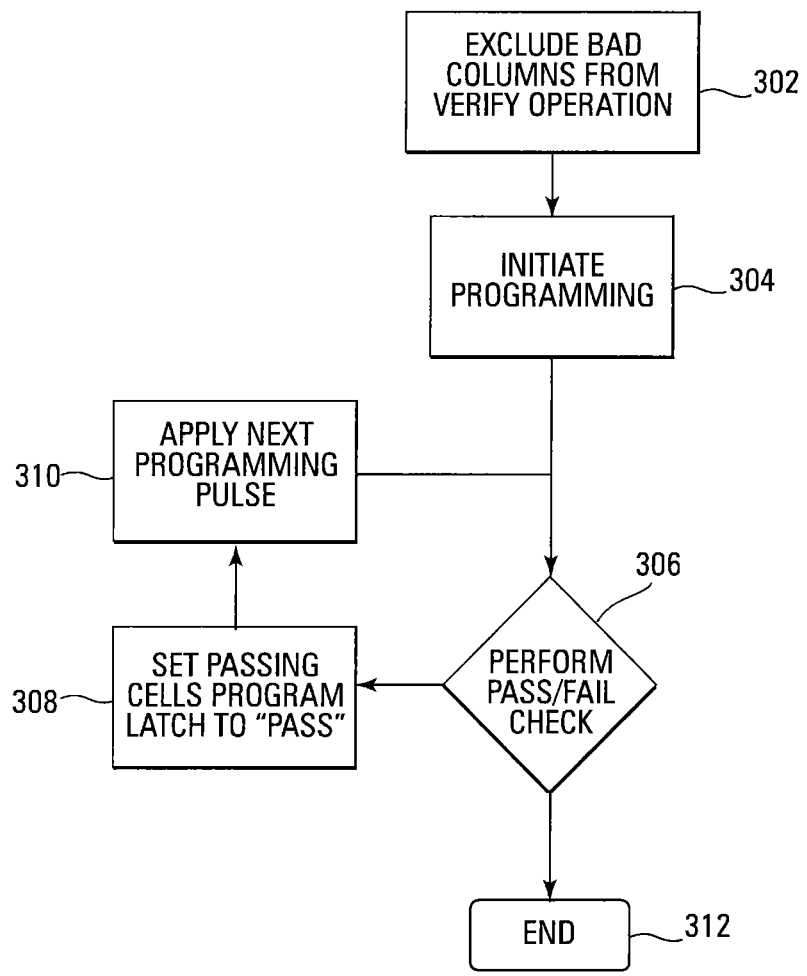
FIG. 3 is a flow chart diagram of a method according to another embodiment of the present disclosure.

In operation, a memory array having the common lines such as lines 206, 208 connecting page buffers of the same rank (i.e., all bit_0 page buffers of a page) functions as is shown and discussed in the flow chart diagram of FIG. 3, with reference to FIG. 2. For programming, certain columns may be identified through testing, or through earlier discovery, that are bad, that is, are not to be used. For those columns, each are marked as bad in a register or other type of storage. Columns marked as bad are excluded from verification operations in block 302. This is accomplished in one embodiment by loading bad column data into a page buffer for the page being programmed, which inhibits those columns before a first program pulse of a series of programming pulses, and for the duration of the programming sequence.

Upon initiation of programming pulses in block 304, after a first programming pulse, some cells will have been programmed and some likely will not have been programmed, i.e., failed. A pass/fail check is performed in block 306. If all cells have been programmed, the process is complete and ends at block 312. If not, all cells that have been programmed have their respective program latches set to "pass" status at block 308, and a next program pulse is applied at block 310. The pass/fail check with a sequence of increasing magnitude programming pulses is completed until all cells have been verified as programmed.

As noted, as each cell is passed, that is, as each cell is identified through verification as passing (i.e., programmed to its desired threshold voltage), the program latch for that cell is set in block 308. To accomplish this, in one embodiment, the output of the program latch is set at a logic 0 if the cell is indicated as having been programmed. Then, for verification, the common line is precharged, and the check transistor is turned on. If the cell is programmed, the logic 0 output of the program latch keeps its program indicator transistor off, and the common line is not discharged. If the cell remains unprogrammed (i.e., failing), then the common line is discharged and cell programming failure is detected. Programming continues in this fashion until all cells are successfully programmed and indicated as passed. If a cell fails to program, then the program latch remains set at a logic 1, and the common line is discharged when its check transistor is turned on.

Figure 4:
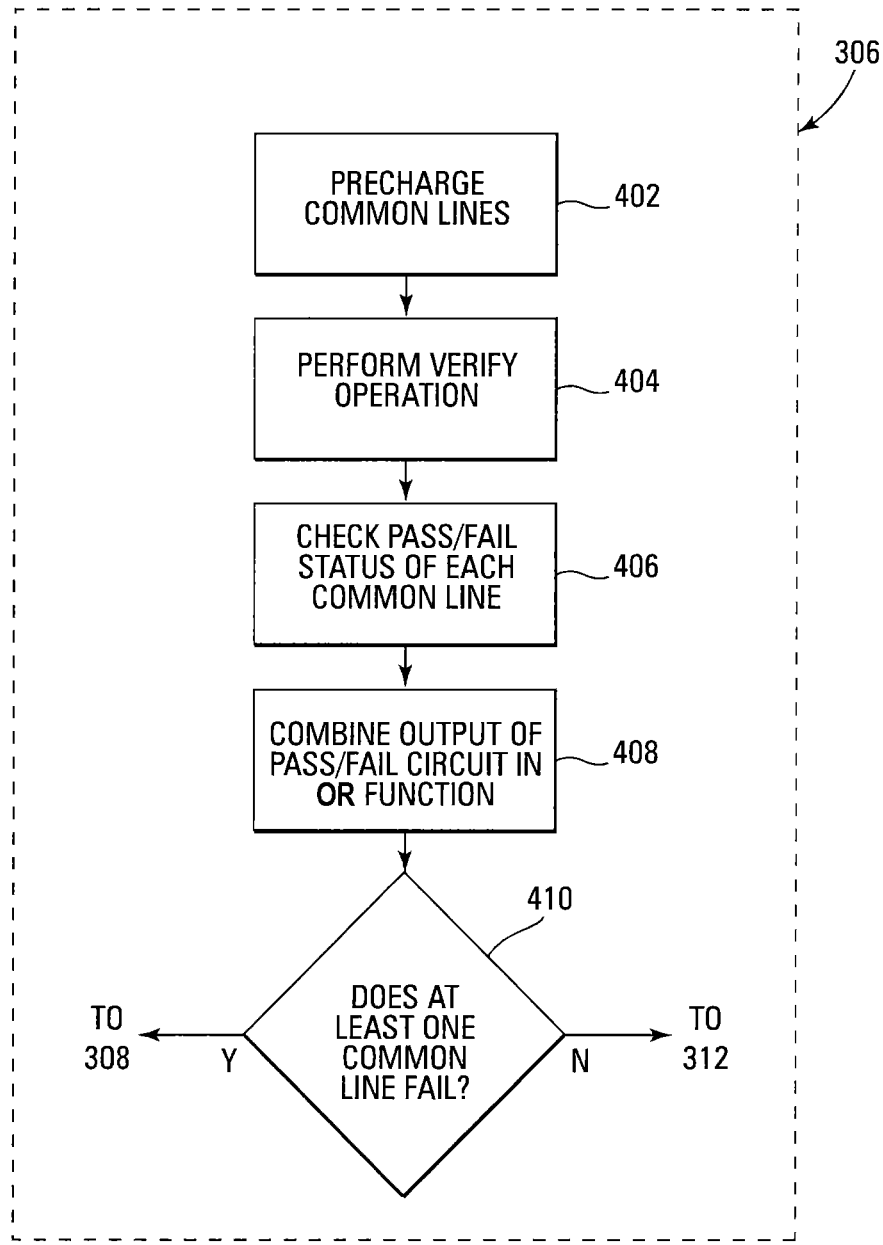
FIG. 4 is a flow chart diagram of a method according to yet another embodiment of the present disclosure.

The pass/fail check 306 is discussed in further detail with respect to FIG. 4. For the pass/fail check process of block 306, the common lines of the page are precharged in block 402, and a verify operation is performed in block 404. The verify operation discharges one or more of the common lines if the page does not pass verification. The pass/fail status of each common line is indicated by its pass/fail circuit at block 406, and the output of the pass/fail circuits is combined in OR circuitry at block 408. In decision block 410, if the OR circuit indicates all common lines pass, process flow continues at block 312, and if the OR circuit indicates that at least one of the common lines fails, process flow continues at block 308.

Figure 5:
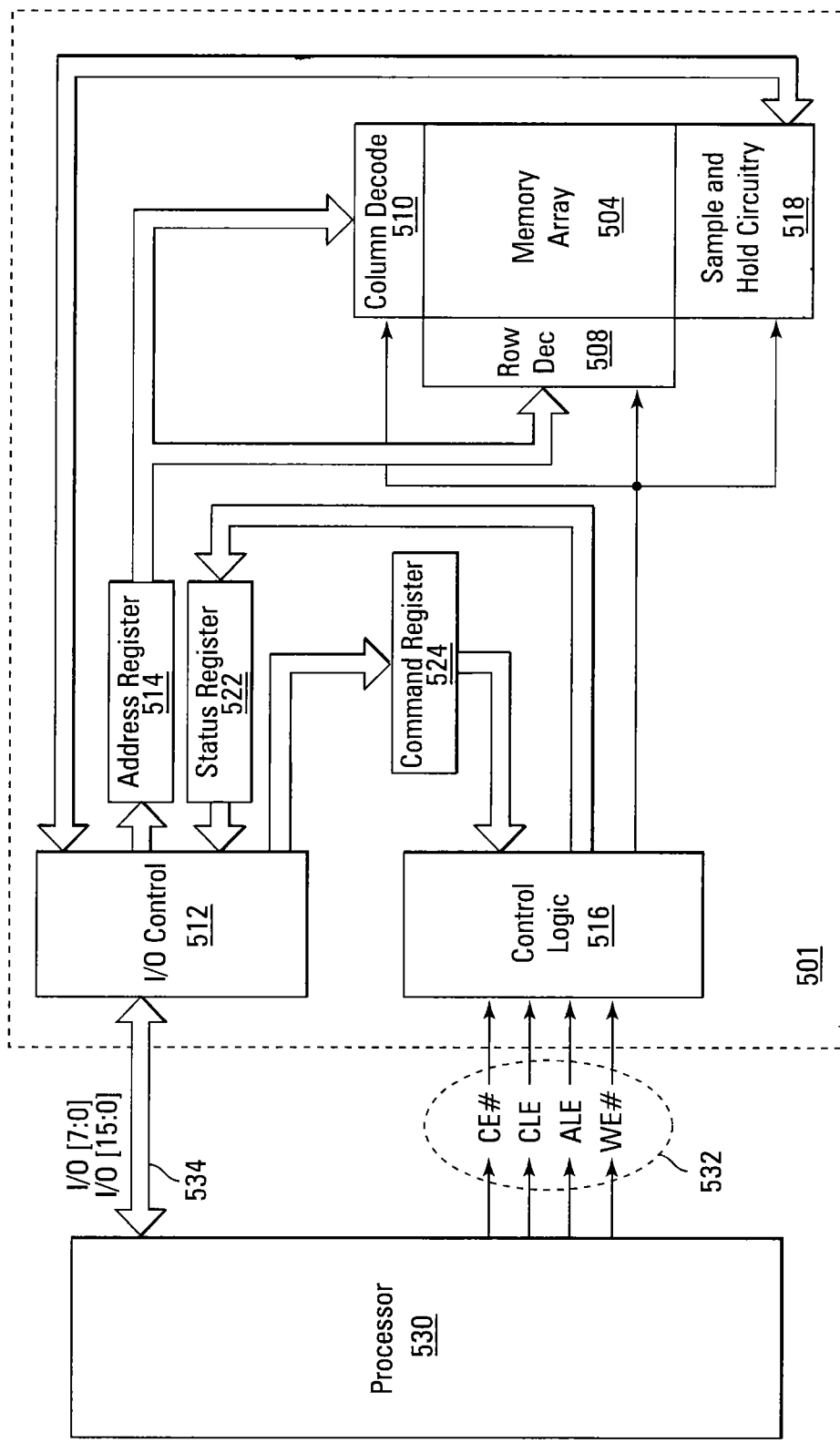
FIG. 5 is a functional block diagram of an electrical system having at least one memory device with a memory array configuration according to one embodiment of the present invention.

FIG. 5 is a simplified block diagram of a memory device 501 according to an embodiment of the disclosure, and on which various embodiments of the disclosure can be practiced. Memory device 501 includes an array of memory cells 504 arranged in rows and columns. Although the various embodiments will be described primarily with reference to NAND memory arrays, the various embodiments are not limited to a specific architecture of the memory array 504. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 508 and a column decode circuitry 510 are provided to decode address signals provided to the memory device 501. Address signals are received and decoded to access memory array 504. Memory device 501 also includes input/output (I/O) control circuitry 512 to manage input of commands, addresses and data to the memory device 501 as well as output of data and status information from the memory device 501. An address register 514 is coupled between I/O control circuitry 512 and row decode circuitry 508 and column decode circuitry 510 to latch the address signals prior to decoding. A command register 524 is coupled between I/O control circuitry 512 and control logic 516 to latch incoming commands. Control logic 516 controls access to the memory array 504 in response to the commands and generates status information for the external processor 530. The control logic 516 is coupled to row decode circuitry 508 and column decode circuitry 510 to control the row decode circuitry 508 and column decode circuitry 510 in response to the addresses.

Control logic 516 can be coupled to a sample and hold circuitry 518. The sample and hold circuitry 518 latches data, either incoming or outgoing, in the form of analog data signals. For example, the sample and hold circuitry could contain capacitors or other analog storage devices for sampling either an incoming data signal representing data to be written to a memory cell or an outgoing data signal indicative of the threshold voltage sensed from a memory cell. The sample and hold circuitry 518 may further provide for amplification and/or buffering of the sampled signal to provide a stronger data signal to an external device.

The handling of analog data signals may take an approach similar to an approach well known in the area of CMOS imager technology, where charge levels generated at pixels of the imager in response to incident illumination are stored on capacitors. These charge levels are then converted to signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a data signal indicative of an actual or target threshold voltage of a memory cell for reading or programming, respectively, the memory cell. This charge could then be converted to an analog data signal using a differential amplifier having a grounded input or other reference signal as a second input. The output of the differential amplifier could then be passed to the I/O control circuitry 512 for output from the memory device, in the case of a read operation, or used for comparison during one or more verify operations in programming the memory device. It is noted that the I/O control circuitry 512 could optionally include analog-to-digital conversion functionality and digital-to-analog conversion (DAC) functionality to convert read data from an analog data signal to a digital bit pattern and to convert write data from a digital bit pattern to an analog signal such that the memory device 501 could be adapted for communication with either an analog or digital data interface.

During a write operation, target memory cells of the memory array 504 are programmed, for example using two sets of programming pulses as described above, until voltages indicative of their Vt levels match the levels held in the sample and hold circuitry 518. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 518 for transfer to an external processor (not shown in FIG. 5) either directly as analog signals or as digitized representations of the analog signals depending upon whether ADC/DAC functionality is provided external to, or within, the memory device.

Threshold voltages of cells may be determined in a variety of manners. For example, an access line, such as those typically referred to as word lines, voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 518 may include caching, i.e., multiple storage locations for each data value, such that the memory device 501 may be reading a next data value while passing a first data value to the external processor, or receiving a next data value while writing a first data value to the memory array 504. A status register 522 is coupled between I/O control circuitry 512 and control logic 516 to latch the status information for output to the external processor.

Memory device 501 receives control signals at control logic 516 over a control link 532. The control signals may include a chip enable CE#, a command latch enable CLE, an address latch enable ALE, and a write enable WE#. Memory device 501 may receive commands (in the form of command signals), addresses (in the form of address signals), and data (in the form of data signals) from an external processor over a multiplexed input/output (I/O) bus 534 and output data to the external processor over I/O bus 534.

In a specific example, commands are received over input/output (I/O) pins [7:0] of I/O bus 534 at I/O control circuitry 512 and are written into command register 524. The addresses are received over input/output (I/O) pins [7:0] of bus 534 at I/O control circuitry 512 and are written into address register 514. The data may be received over input/output (I/O) pins [7:0] for a device capable of receiving eight parallel signals, or input/output (I/O) pins [15:0] for a device capable of receiving sixteen parallel signals, at I/O control circuitry 512 and are transferred to sample and hold circuitry 518. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 5 has been simplified to help focus on the embodiments of the disclosure.

A program and verify function on selected pages or the like of the memory 500 is performed as described above with respect to the structure of FIG. 2, and the methods of FIGS. 3 and 4 associated therewith.

While FIG. 5 has been described with respect to sample and hold circuitry 518, it should be understood that the control logic 516 could be coupled to data latches instead of sample and hold circuitry 518 without departing from the scope of the disclosure. Data latches latch data, either incoming or outgoing. During a write operation, target memory cells of the memory array 504 are programmed, for example using two sets of programming pulses as described above, until voltages indicative of their Vt levels match the data held in the data latches. This can be accomplished, as one example, using differential sensing devices to compare the held data to a threshold voltage of the target memory cell.

Additionally, while the memory device of FIG. 5 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 534. Because the data signals represent bit patterns instead of individual bits, serial communication of an 8-bit data signal could be as efficient as parallel communication of eight signals representing individual bits.

CONCLUSION

Methods of programming a memory and memories using the methods have been described that, among other things, can increase array efficiency by reducing the amount of circuitry used in the periphery of the array. Individual bit and byte failures can be detected without a data detector and knock-out latch using a plurality of common lines, one for each rank of page buffers corresponding to a page, and the combination of pass/fail circuit outputs into OR logic to determine whether all cells on a page have been successfully programmed or not.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of operating a memory device, comprising:
precharging a plurality of common lines, each common line connected in parallel to each page buffer of a corresponding plurality of page buffers, wherein each page buffer of the corresponding plurality of page buffers for a given common line corresponds to a particular bit position of a plurality of bytes;
sensing a voltage on each of the common lines;
indicating a pass of a common line of the plurality of common lines when each page buffer to which it is connected indicates as a pass bit; and
indicating a fail of a common line of the plurality of common lines when any page buffer to which it is connected indicates as a fail bit.

2. The method of claim 1, and further comprising:
combining each of the plurality of common lines in an OR circuit, wherein a logic 0 at an output of the OR circuit indicates a passing condition of the plurality of bytes of the memory device, and wherein a logic 1 at the output of the OR circuit indicates a failing condition of the plurality of bytes of the memory device.

3. The method of claim 1, wherein indicating a fail further comprises discharging at least one of the plurality of common lines.

4. The method of claim 3, wherein discharging comprises discharging any of the plurality of common lines that has at least one page buffer connected thereto that is selectively coupled to a memory cell that fails verification.

5. The method of claim 1, wherein indicating a pass further comprises not discharging any of the plurality of common lines.

6. The method of claim 1, and further comprising combining pass/fail data for each of the plurality of common lines to indicate a page pass/fail status.

7. The method of claim 1, and further comprising setting a program latch for each memory cell that passes verification.

8. The method of claim 1, and further comprising identifying a specific failed bit on a particular common line of the plurality of common lines.

9. The method of claim 8, wherein identifying a specific failed bit further comprises:
precharging the particular common line;
inhibiting all columns coupled to the page buffers connected to the particular common line except one; and
discharging the particular common line when the page buffer coupled to the one uninhibited column and connected to the particular common line indicates a failing bit.

10. The method of claim 1, and further comprising:
detecting a fail condition for a page buffer.

11. The method of claim 10, wherein detecting a fail condition comprises:
inhibiting all columns not selectively coupled to the page buffer; and
performing verification on a memory cell selectively coupled to the page buffer.

12. A memory device, comprising:
an array of memory cells; and
circuitry for control and/or access of the array of memory cells, the control circuitry configured to perform a method comprising:
precharging a plurality of common lines, each common line connected in parallel to each page buffer of a corresponding plurality of page buffers, wherein each page buffer of the corresponding plurality of page buffers for a given common line corresponds to a particular bit position of a plurality of bytes;
sensing a voltage on each of the common lines;
indicating a pass of a common line of the plurality of common lines when each page buffer to which it is connected indicates as a pass bit; and
indicating a fail of a common line of the plurality of common lines when any page buffer to which it is connected indicates as a fail bit.

13. The memory device of claim 12, wherein the control circuitry is further configured to combine each of the plurality of common lines in an OR circuit, and to indicate a passing condition of the plurality of bytes of the memory device when an output of the OR circuit is a logic 0.

14. The memory device of claim 13, wherein the control circuitry is further configured to indicate a failing condition of the plurality of bytes of the memory device when an output of the OR circuit is a logic 1.

15. The memory device of claim 12, wherein the control circuitry is further configured to set a program latch for each memory cell that passes verification.

16. The memory device of claim 12, wherein the control circuitry is further configured to identify a specific failed bit on a particular common line of the plurality of common lines.

17. The method of claim 16, wherein the control circuitry is further configured to identify the specific failed bit by pre-charging the particular common line, selectively inhibiting all page buffers along the particular common line except one, and discharging the particular common line when the bit on the particular common line and the not inhibited page buffer is a failing bit.

18. A memory device, comprising:
an array of memory cells;
circuitry for control and/or access of the array of memory cells;
a plurality of page buffers;
a plurality of common lines, each common line connected in parallel to a corresponding group of page buffers of the plurality of page buffers corresponding to a respective bit position of a plurality of bytes; and
a plurality of pass/fail circuits, each of the plurality of pass/fail circuits connected to a respective one of the plurality of common lines.

19. The memory device of claim 18, and further comprising an OR circuit connected to each of the plurality pass/fail circuits.

20. A memory, comprising:
an array of memory cells;
circuitry for control and/or access of the array of memory cells;
a plurality of page buffers;
a plurality of common lines, each common line connected in parallel to one bit of each of the plurality of page buffers of a respective rank corresponding to a page of the array of memory cells;
a plurality of check transistors, a check transistor for each page buffer, each check transistor connected to one of the plurality of common lines through one of a plurality of program transistors;
a plurality of latches, a latch connected to the gate of each program transistor; and
a plurality of pass/fail circuits, a pass/fail circuit connected to each of the plurality of common lines.

21. The memory of claim 20, and further comprising an OR circuit connected to each of the plurality pass/fail circuits.

\* \* \* \* \*